(12) United States Patent
Kusumi et al.

(10) Patent No.: US 6,228,755 B1
(45) Date of Patent: May 8, 2001

(54) SEMICONDUCTOR DEVICE, AND MANUFACTURING METHOD THEREFOR

(75) Inventors: Yoshihiro Kusumi; Satoshi Iida; Kazunori Yoshikawa, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/266,853

(22) Filed: Mar. 12, 1999

(30) Foreign Application Priority Data

Sep. 11, 1998 (JP) .................................................. 10-258331

(51) Int. Cl.⁷ .............................................. H01L 21/4763
(52) U.S. Cl. ........................... 438/618; 438/639; 438/640
(58) Field of Search .................................... 438/618, 638, 438/639, 640, 701

(56) References Cited

U.S. PATENT DOCUMENTS 5,874,201 * 2/1999 Licata e al. .......................... 430/314
5,989,997 * 11/1999 Lin et al. ............................... 438/662
6,025,259 * 11/1999 Yu et al. ................................ 438/618

FOREIGN PATENT DOCUMENTS

| 8-335634 | 12/1996 | (JP) . |
| 9-153545 | 6/1997 | (JP) . |
| 10-64995 | 3/1998 | (JP) . |

* cited by examiner

Primary Examiner—Caridad Everhart
(74) Attorney, Agent, or Firm—McDermott, Will & Emery

(57) ABSTRACT

Described is a semiconductor device having a buried multilayer wiring structure, in which there is ensured good conductivity among a plurality of wiring layers. A lower wiring pattern is formed from conductive material, and an upper wiring pattern is formed from conductive material. Insulating layers are provided between the lower wiring pattern and the upper wiring pattern. A connection section is formed so as to penetrate through the insulating layers to thereby establish continuity between the lower and upper wiring patterns, as well as to have a greater cross-sectional area at the end facing the upper wiring pattern and a smaller cross-sectional area at the end facing the lower wiring pattern.

11 Claims, 18 Drawing Sheets

1

SEMICONDUCTOR DEVICE, AND MANUFACTURING METHOD THEREFOR

BACKGROUND OF THE INVENTION

1. Field of the Invention

The present invention generally relates to a semiconductor device having a multilayer wiring structure and to a manufacturing method therefor. More particularly, the present invention relates to a semiconductor device having a buried multilayer structure as well as to a manufacturing method suitable for manufacturing the same.

2. Description of the Background Art

FIGS. 16A to 16F are cross-sectional views for describing a method of manufacturing a former semiconductor device having a buried multilayer wiring structure. This manufacturing method will hereinafter be referred to as a "first former method." In FIGS. 16A and 16B, reference numeral 10 designates an interlayer insulating film; 12 designates a lower wiring pattern; 14 designates a connection hole stopper film; 16 designates a lower interlayer insulating film; 18 designates an upper trench stopper film; 20 designates a resist mask for use in forming a connection hole (hereinafter referred to simply as a "resist mask"); 21 designates an upper interlayer insulating film; 22 designates a resist mask for use in forming an upper trench (hereinafter referred to simply as an "upper trench resist mask"); 24 designates a connection hole; 26 designates an upper wiring trench; and 28 designates conductive material.

Under the first former method, after the lower wiring pattern 12 has been formed on the interlayer insulating film 10, the connection hole stopper film 14 is formed so as to cover the lower wiring pattern 12. Subsequently, the lower insulating film 16 and the upper trench stopper film 18 are formed, in this sequence, on the connection hole stopper film 14 (see FIG. 16A) Next, the resist mask 20 is formed on the upper trench stopper film 18 by means of photolithography. Through dry etching, a connection hole is formed in the upper trench stopper film 18 (see FIG. 16B).

The resist mask 20 is removed, and an upper insulation film 21 is formed on the upper trench stopper film 18 (see FIG. 16C).

The upper trench resist mask 22 is formed on the upper insulating film by means of photolithography. The upper wiring trench 26 is formed in the upper insulating film 21 by means of dry etching. At this time, as a result of simultaneous removal of the portion of the lower insulating film 16 underlying the bottom of the connection hole formed in the upper trench stopper film 18, a connection hole 24 is formed in a self-aligned manner until it reaches the connection hole stopper film 14 (see FIG. 16D).

After removal of the upper trench resist mask 22 followed by removal of the exposed connection hole stopper film 14 at the bottom of the connection hole 24, conductive material 28 is deposited in the connection hole 24 and the upper wiring trench 26 as well as on the upper insulating film 21 (see FIG. 16E).

Finally, only the conductive material 28 deposited on the upper insulating film 21 is removed by means of Chemical-and-Mechanical Polishing (CMP), thereby resulting in formation of a desired structure (see FIG. 16F). As mentioned above, according to the first former method, on a semiconductor substrate there can be formed a multilayer wiring structure comprising a plurality of wiring layers between which continuity is established at predetermined locations.

FIGS. 17A to 18D are cross-sectional views for describing a method of manufacturing a former semiconductor device having a buried multilayer wiring structure disclosed in Japanese Patent Application Laid-open No. 8-335634. This method will be hereinafter referred to as a "second former method." In FIGS. 17A through 18D, reference numeral 12 designates a lower wiring pattern; 20 designates a resist mask for use in forming a connection hole; 22 designates a resist mask for use in forming an upper trench (hereinafter referred to simply as an "upper trench resist mask"); 24 designates a connection hole; 26 designates an upper wiring trench; 28 designates conductive material; 30 designates an interlayer insulating film; and 32 designates an organic compound.

Under the second former method, after formation of the interlayer insulating film 30 on the lower wiring pattern 12, the resist mask 20 is formed on the interlayer insulating film 30 by means of photolithography (see FIG. 17A).

The connection hole 24 is formed by means of dry etching so as to penetrate the interlayer insulating film 30 until it reaches the lower wiring pattern 12. After formation of the connection hole 24, the resist mask 20 is removed (see FIG. 17B) The organic compound 32, which has an etching selectivity ratio of 0.5 or less with respect to the interlayer insulating film 30 is deposited on the interior of the connection hole 24 and on the interlayer insulating film 30 (see FIG. 17C).

The organic compound 32 is removed from the top of the interlayer insulating film 30 in such a way that the organic compound 32 is left solely in the connection hole 24 (see FIG. 17D).

The resist mask 22 is formed on the interlayer insulating film 30 by means of photolithography. The resist mask 22 is patterned in such a way that an opening is formed in a location on the resist mask 22 corresponding to an area including the connection hole 24, i.e., an area including the remaining organic compound 32 (see FIG. 18A).

After formation of the resist mask 22, the interlayer insulating film 30 is etched to a predetermined depth by means of dry etching. As a result, the upper wiring trench 26 is formed (see FIG. 18B).

The organic compound 32 still remaining in the connection hole 24 and the resist mask 22 are simultaneously removed (see FIG. 18C).

Finally, a desired structure is formed by deposition of the conductive material 28 on the connection hole 24 and in the upper wiring trench 26 (see FIG. 18H). As mentioned above, even under the second former method, there can be formed a multilayer wiring structure comprising a plurality of wiring layers between which continuity is established at predetermined locations.

However, under either of the first and second former method, in a case where a connection hole has a wide aspect ratio—particularly, where the aspect ratio exceeds a value of 2.5—or in a case where a connection hole has a small diameter,—particularly, where the diameter is 0.28 $\mu$m or less—conductive material cannot be correctly filled into the connection hole. For this reason, in a case where the multilayer wiring structure is sufficiently miniaturized, the former manufacturing method poses a problem of a contact failure being apt to arise between an upper wiring layer and a lower wiring layer.

Accurate formation of a multilayer wiring structure to be incorporated into a semiconductor device becomes important for pursuit of miniaturization of the semiconductor device. As in the case with the foregoing first former method, etching the lower interlayer insulating film 16 or the upper interlayer insulating film 21 through use of the connection hole stopper film 14 and the upper trench stopper film 18 is effective in accurately forming a multilayer wiring structure to be incorporated in the semiconductor device.

However, a silicon nitride film has a dielectric constant greater than that of a silicon oxide film. For this reason, existence of a silicon nitride layer in the multilayer wiring structure results in an increase in the interlayer capacitance of the silicon substrate. The operating speed of the semiconductor device decreases as an interlayer capacitance of the semiconductor device increases. For this reason, depending on the former semiconductor device manufacturing method, it is not necessarily easy to accurately fabricate a multilayer wiring structure while imparting a superior high-speed operating characteristic to the semiconductor device.

SUMMARY OF THE INVENTION

The present invention has been conceived to solve the previously-mentioned problems, and a general object of the present invention is to provide a novel and useful semiconductor device and a manufacturing method therefor.

A more specific object of the present invention is to provide a semiconductor device having an advantage of ensuring superior conductivity among a plurality of wiring layers when the semiconductor device is sufficiently miniaturized.

The above object of the present invention is achieved by a semiconductor device described below. The semiconductor device includes a first and a second wiring patterns composed of conductive material. The device also includes an insulation layer interposed between the first and second wiring patterns. The device further includes a connection section. The connection section penetrates through the insulating layer so as to establish continuity between the first and second wiring patterns. The connection section has a larger cross-sectional area at the end facing the second wiring pattern and a smaller cross-sectional area at the end facing the first wiring pattern.

A second object of the present invention is to provide a semiconductor device having an advantage of ensuring a superior high-speed operating characteristic when the semiconductor device is sufficiently miniaturized.

The above object of the present invention is achieved by a semiconductor device described below. The device has a conductive section formed from conductive material in a silicon oxide film. The conductive section includes a connection section having a first diameter at its end. The conductive section also includes a primary conductive section which is in electrical connection with the end of the connection section by way of a portion having a first width greater than the first diameter. The device also includes a silicon nitride film which is provided at a step structure formed in a boundary region between the connection section and the primary conductive section. The silicon nitride film extends beyond both ends of the primary conductive section by a predetermined length.

A third object of the present invention is to provide a semiconductor device manufacturing method suitable for ensuring good conductivity among a plurality of wiring layers while sufficiently miniaturizing a semiconductor device.

The object of the present invention is achieved by a method of manufacturing a semiconductor device having the steps described below. The method has steps for forming a first and a second wiring patterns from conductive material. The method has a step for forming in the interlayer insulation film a trench to be used for forming a second wiring pattern. The method has a step for causing the surface of the first wiring pattern to be exposed in the trench and forming a connection hole in such a way that the opening area of the connection hole at the end facing the trench becomes larger than the opening area of the connection hole at the end facing the first wiring pattern. The method also has a step for forming a connection section from conductive material in the connection hole, and a step for forming a second wiring pattern from conductive material in the trench.

A fourth object of the present invention is to provide a semiconductor device manufacturing method suitable for sufficiently miniaturizing a semiconductor device and for imparting a superior high-speed operating characteristic to the semiconductor device.

The object of the present invention is achieved by a method of manufacturing a semiconductor device having the steps described below. The method has a step for growing on a silicon substrate a stopper film composed of a silicon nitride film. The method has a step for etching the stopper film into a predetermined shape. The method has a step for depositing an insulating film composed of a silicon oxide film in the region including the stopper film. The method also has a step for eliminating a predetermined portion of the insulating film which is smaller than the stopper film until the stopper film is exposed, thereby forming a space penetrating through the insulating film; and a step for eliminating the exposed stopper film in the space.

Other objects and further features of the present invention will be apparent from the following detailed description when read in conjunction with the accompanying drawings.

DESCRIPTION OF THE PREFERRED EMBODIMENTS

Figure 1A:
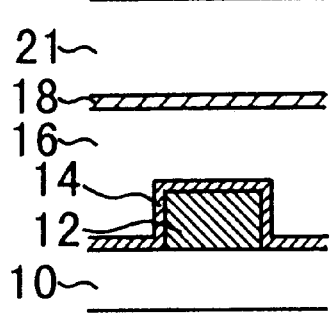
FIGS. 1A through 1E are cross-sectional views for describing a manufacturing method of a semiconductor device according to a first embodiment of the present invention.

In the following, principles and embodiments of the present invention will be described with reference to the accompanying drawings. Throughout the drawings, like reference numerals designate like or corresponding parts, and descriptions of such parts are omitted where they are repetitive.

First Embodiment

FIGS. 1A through 1E are cross-sectional views for describing a method of manufacturing a semiconductor device according to a first embodiment of the present invention. Reference numeral 10 designates an interlayer insulating film; 12 designates a lower wiring pattern; 14 designates a connection hole stopper film; 16 designates a lower interlayer insulating film; 18 designates an upper trench stopper film; 20 designates a resist mask for use in forming a connection hole (hereinafter referred to simply as a "resist mask"); 21 designates an upper interlayer insulating film; 22 designates a resist mask for use in forming an upper trench (hereinafter referred to simply as an "upper trench resist mask"); 24 designates a connection hole; 26 designates an upper wiring trench; and 28 designates conductive material. Further, as shown in FIGS. 1A through 1E, reference numeral 34 designates a connection preparation hole; 36 designates a connecting section; and 38 designates an upper wiring pattern.

Under the semiconductor device manufacturing method according to the first embodiment, the connection hole stopper film 14 is formed so as to cover the lower wiring pattern 12 formed on the interlayer insulating film 10. The lower insulating film 16, the upper trench stopper film 18, and the upper insulating film 21 are formed on the connection hole stopper film 14, in this sequence (see FIG. 1A). Although in the first embodiment plasma TEOS (Tetra Ethyl Ortho Silicate) is used for fabricating the interlayer insulating film 10, the lower insulating film 16, and the upper insulating film 21, these films are not limited to the plasma TEOS; the films may be formed by means of other technique such as CVD-TEOS or SOG (Spin On Glass). Further, although the first embodiment uses Cu for forming the lower wiring pattern 12, the lower wiring pattern 12 is not limited to this material; an alloy of aluminum may also be used for the lower wiring pattern 12. Moreover, although the first embodiment uses plasma SiN for fabricating the connection hole stopper film 14 and the upper trench stopper film 18, these films are not limited to the plasma SiN; another insulating film may also be used as the connection hole stopper film 14 and the upper trench stopper film 18, so long as the insulating film has an etching selective ratio of 0.5 or less with respect to the lower insulating film 16 and the upper insulating film 21 by means of dry etching.

Under the semiconductor device manufacturing method according to the first embodiment, the resist mask 20 is formed on the upper insulating film 21 by means of photo-lithography. Subsequently, by means of dry etching through use of an Electron Cyclotron Resonance (ECR) Reactive Ion Etching (RIE) System, the connection preparation hole 34 is formed in the bottom of the opening of the resist mask 20 until it reaches the connection hole stopper film 14 (see FIG. 1B). More specifically, the upper insulating film 21 and the lower insulating film 16 are etched by means of plasmas consisting of a mixed gas of $C_4F_8+O_2$. The upper trench stopper film 18 is etched by means of plasmas consisting of a mixed gas of $CF_4+O_2$.

The etching selective ratio of the upper insulating film 21 with respect to the upper trench stopper film 18 is about 10, and the etching selective ratio of the lower insulating film 16 with respect to the upper trench stopper film 18 is also about 10. The connection hole stopper film 14 is provided at a deeper portion than the upper trench stopper film 18 is. In other words, an aspect ratio at a portion where the connection hole stopper film 14 is located is higher than that at a portion where the upper trench stopper film 18 is located. Thus, the etching selective ration of the upper insulating film 21 or the lower insulating film 16 with respect to the connection hole stopper film 14 is about 20. Through the foregoing etching processes, the connection preparation hole 34 is formed so as to penetrate through the upper insulating film 21, the upper trench stopper film 18, and the lower insulating film 16 until it reaches the connection stopper film 14.

The resist mask 20 is removed by means of ashing. Subsequently, the upper trench resist mask 22 is formed on the upper insulating film 21. The upper trench resist mask 22 is patterned in such a way that an opening is formed in a portion of the resist mask 22 corresponding to the area including the connection preparation hole 34. After formation of the upper trench resist mask 22, the upper wiring trench 26 is formed in the upper insulating film 21 by means of dry etching (FIG. 1C).

The upper insulating film 21 is dry-etched in the ECR-type IRE system through use of plasmas consisting of a mixed gas of $C_4F_8+O_2$ on condition in which the etching selective ration of the upper insulating film 21 with respect to the upper trench stopper film 18 assumes a value of about 5 to 7. If the upper insulating film 21 is dry-etched on the condition which realizes the comparatively low etching selective ratio with respect to the upper trench stopper film 18, the opening area of the upper trench stopper film 18 becomes slightly enlarged within the connection preparation hole 24. As a result, the area of the connection preparation hole 34 between the lower edge of the upper trench stopper film 18 and the connection hole stopper film 14 becomes tapered.

Under the semiconductor device manufacturing method according to the first embodiment, the cone angle of the connection preparation hole 34 can be adjusted by controlling a period of time during which the upper insulating film 21 is subjected to overetching; i.e., a period of time during which the upper insulating film 21 is exposed to the etch process beyond a time that is required for creating the upper wiring trench 26. As shown in FIG. 1C, according to the first embodiment, the cone angle of the connection preparation hole 34 is set in such a way that the maximum diameter of the connection preparation hole 34; i.e., the diameter of the connection preparation hole 34 at the position of the upper trench stopper film 18, becomes equal to the width of the upper wiring trench 26. However, the setting of the cone angle of the connection preparation hole 34 is not limited to this. The width of the upper wiring trench 26 may be set so as to become larger than the maximum diameter of the connection preparation hole 34.

Upon completion of the foregoing processing, the upper trench resist mask 22 is removed by means of ashing, and the exposed connection hole stopper film 14 at the bottom of the connection preparation hole 34 is removed. As a result of the removal of the connection hole stopper film 14, the tapered connection hole 24 is formed so as to have a larger cross sectional area at the end adjoining the upper wiring trench 26 and a smaller cross sectional area at the end adjoining the lower wiring pattern 12.

Figure 1C:
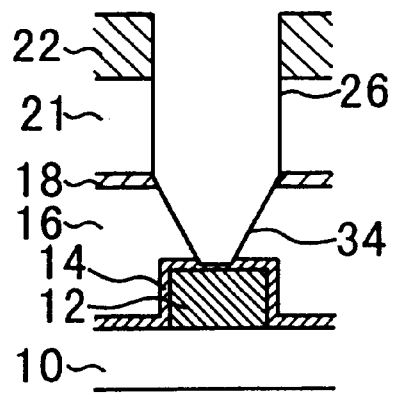
Figure 1B:
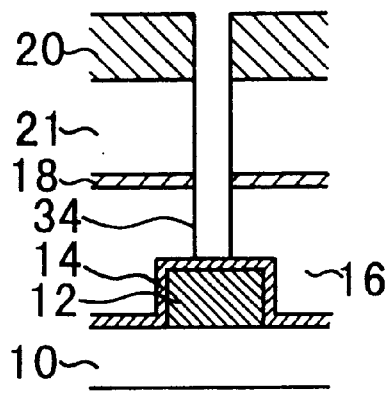
Figure 1D:
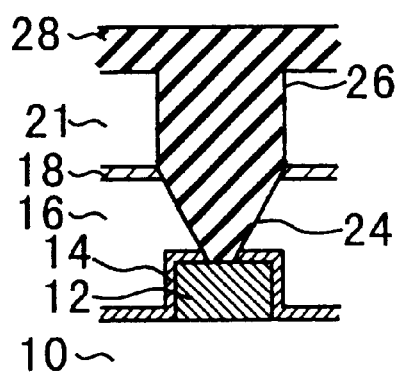

After formation of the tapered connection hole 24, the conductive material is deposited in the connection hole 24 and the upper wiring trench 26 and on the upper insulating film 21 (see FIG. 1D).

Finally, only the conductive material 28 deposited on the upper insulating film 21 is removed by means of CMP. After completion of the forgoing processing steps, a multilayer structure is formed in the semiconductor device, wherein continuity is established between the lower wiring pattern 12 and the upper wiring pattern 38 by way of the tapered connecting section 36 (see FIG. 1E).

Although in the first embodiment the ECR-type RIE system is used as a dry-etcher, the dry-etcher is not limited to this type of system; another type of system, e.g., a parallel plate RIE system, a magnetron RIE system, or an inductively coupled plasma etching system, may also be used as a dry-etcher.

As mentioned above, under the semiconductor manufacturing method, the tapered connection hole 24 is formed on the lower wiring pattern 12, and the conductive material 28 is deposited in the tapered connection hole 24, thereby resulting in formation of the connecting section 36. Under the semiconductor device manufacturing method according to the first embodiment, the ease of filling the connection hole 24 with the conductive material 28 can be increased. Particularly, in a case where the aspect ratio of the connection hole 24 exceeds a value of 2.5 or where the diameter of the connection hole 24 becomes smaller than a value of 0.28 $\mu$m, the reliability of the semiconductor device can be improved.

Second Embodiment

A second embodiment of the present invention will now be described by reference to FIGS. 2A to 2D.

FIGS. 2A to 2D are cross-sectional views for describing a method of manufacturing a semiconductor device according to the second embodiment of the present invention. In FIGS. 2A to 2D, reference numeral 40 designates a protective film composed of an organic compound. In FIGS. 2A to 2D, the elements assigned reference numerals provided in FIGS. 1A to 1E represent elements identical to those shown in FIGS. 1A to 1E.

Figure 2A:
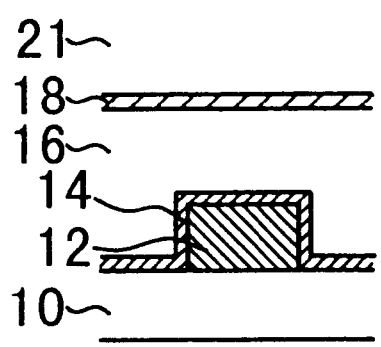
FIGS. 2A through 2D are cross-sectional views for describing a manufacturing method of a semiconductor device according to a second embodiment of the present invention.
Figure 2C:
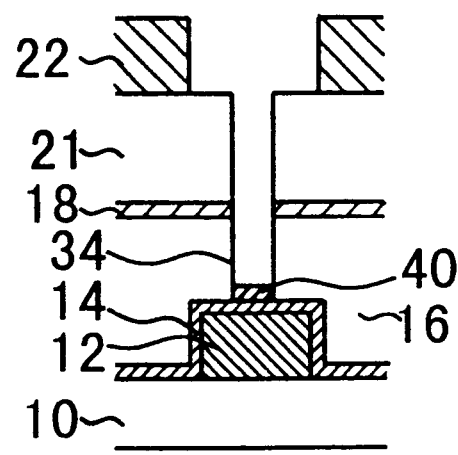
Figure 2B:
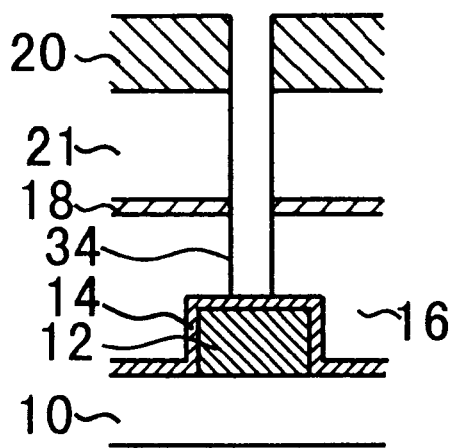

FIGS. 2A and 2B are identical with FIGS. 1A and 1B referred during the description of the first embodiment. That is, under the manufacturing method according to the second embodiment, the structure shown in FIG. 2B is obtained in the same manner as that of the first embodiment.

After formation of the structure shown in FIG. 2B, the resist mask 20 is removed by means of ashing. Under the manufacturing method according to the second embodiment, a protective film 40, such as a resist film, is deposited on the bottom of the connection preparation hole 34. The protective film 40 may be formed by steps of depositing resist on the interior of the connection preparation hole 34 and on the upper insulating film 21, exposing the silicon substrate to light on condition that the area in the vicinity of the bottom of the connection preparation hole 34 is not exposed to light, and removing the resists from the exposed area of the substrate through use of a developer. Alternatively, the protective film 40 maybe formed by the steps of depositing resists on the interior of the connection preparation hole 34 and on the upper insulating film 21, and subjecting the resists to a dry etching process on condition that the resists deposited in the area in the vicinity of the bottom of the connection preparation hole 34 will be left.

Figure 2D:
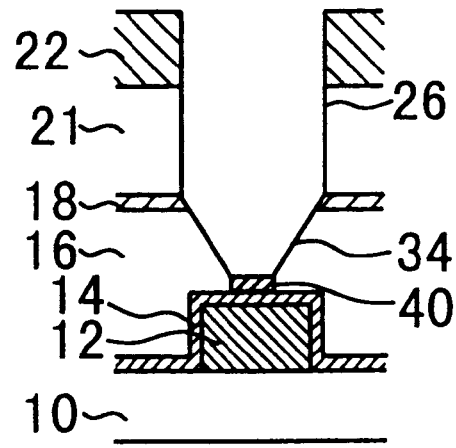

Upon completion of deposition of the protective film 40, the resist mask 22 is formed in such a way that an opening is formed in a portion of the resist mask 22 corresponding to the area including the connection preparation hole 34 (see FIG. 2C) Subsequently, the upper wiring trench 26 is formed in the upper insulating film 21 by means of dry etching (see FIG. 2D). The upper insulating film 21 is exposed to a dry etching process under the same conditions as those employed in the first embodiment, i.e., the conditions under which the upper insulating film 21 is subjected to a dry-etching process in the step shown in FIG. 1C. As a result, the portion of the connection preparation hole 34 that is lower than the wiring trench stopper film 18 is tapered simultaneously with formation of the upper wiring trench 26.

During the course of the dry etching process, the connection hole stopper film 14 is protected by the protective film 40. For this reason, compared with the manufacturing method according to the first embodiment, the manufacturing method according to the second embodiment enables provision of a wider process margin. Thus, the second embodiment is capable of using a wider condition range with regard to the dry etching than that may be used in the first embodiment, thereby enabling to ensure a wide setting range of the cone angle. Further, under the manufacturing method according to the second embodiment, the connection hole stopper film 14 can be made thinner than that formed under the method according to the first embodiment. In a case where the connection hole stopper film 14 is composed of a silicon nitride film, the interlayer capacitance of the semiconductor device becomes lower as the thickness of the silicon nitride film becomes thinner. To impart a characteristic suitable for high-speed operations to the semiconductor device, it is advantageous that the interlayer capacitance of the same is low. In this respect, the manufacturing method according to the second embodiment has an advantage of readily imparting a superior high-speed operation characteristic to the semiconductor device.

Figure 1E:
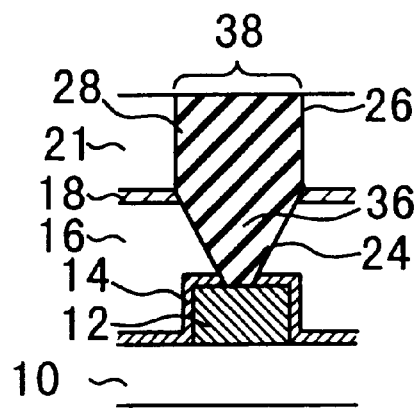

Upon completion of the tapering of the connection preparation hole 34, the silicon substrate is subjected to the processes identical to those shown in FIGS. 1D and 1E according to the first embodiment. Simultaneously, the protective film 40 is eliminated through an ashing process for the purpose of removing the resist mask 22. After completion of the foregoing processing processes, there is formed a multilayer wiring structure in which superior conductivity is established between the lower wiring pattern 12 and the upper wiring pattern 38 by way of the tapered connecting section 36.

Third Embodiment

A third embodiment of the present invention will now be described by reference to FIGS. 3A to 3D.

FIGS. 3A to 3D are cross-sectional views for describing a method of manufacturing a semiconductor device according to the third embodiment. In FIGS. 3A to 3D, the elements assigned the reference numerals provided in FIGS. 1A to 1E represent elements identical to those shown in FIGS. 1A to 1E.

Figure 3A:
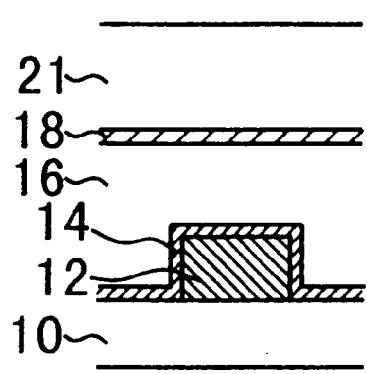
FIGS. 3A through 3D are cross-sectional views for describing a manufacturing method of a semiconductor device according to a third embodiment of the present invention.

FIG. 3A shows the same process as that shown in FIG. 1A and described in the first embodiment. Under the manufacturing method according to the third embodiment, the silicon substrate shown in FIG. 3A is formed as a result of execution of processing steps similar to those performed in the first embodiment.

After formation of the structure shown in FIG. 3A, the resist mask 20 is formed on the upper insulating film 21 by means of photolithography. The connection preparation hole 34 is formed by means of dry etching so as to penetrate through the upper insulating film 21 and the upper trench stopper film 18. Under the manufacturing method according to the third embodiment, the connection preparation hole 34 is formed so as to reach a position immediately below the upper trench stopper film 18 or a predetermined position between the upper trench stopper film 18 and the lower insulating film 16 (see FIG. 3B). The dry etching for forming the hole 34 is executed in an electron cyclotron resonance (ECR) reactive ion etching system. During the dry etching process, a mixed gas of $C_4F_8+O_2$ is used for etching the upper insulating film 21. At this time, the etch selective ratio of the upper insulating film 21 with respect to the upper trench stopper film 18 is about 10. Then, plasmas consisting of a mixed gas of $CF_4+O_2$ is used for etching the upper trench stopper film 18 during the dry etching process. In a case where the connection preparation hole 34 is formed until a position between the upper trench stopper film 18 and the lower insulating film 16, after completion of etching of the upper trench stopper film 18 the lower insulating film 16 is etched under the same condition as that under which an opening is formed in the upper insulating film 21.

Figure 3B:
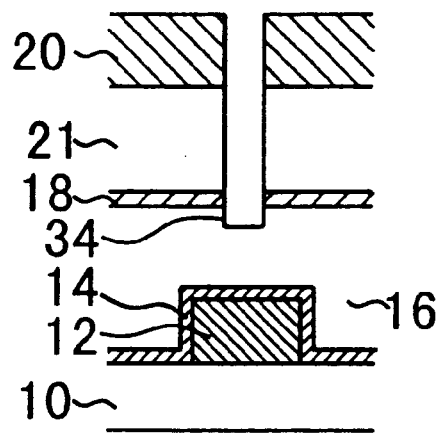
Figure 3C:
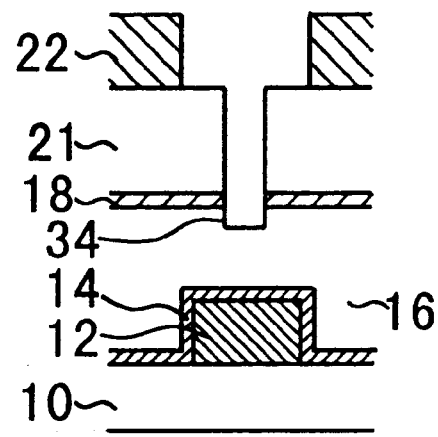

After formation of the connection preparation hole 34 shown in FIG. 3B, the resist mask 20 is removed by means of ashing. Subsequently, the upper trench resist mask 22 is formed on the upper insulating film 21 by means of photolithography (see FIG. 3C). The upper trench resist mask 22 is patterned in such a way that an opening is formed in a portion of the resist mask 22 corresponding to an area including the connection preparation hole 34.

Figure 3D:
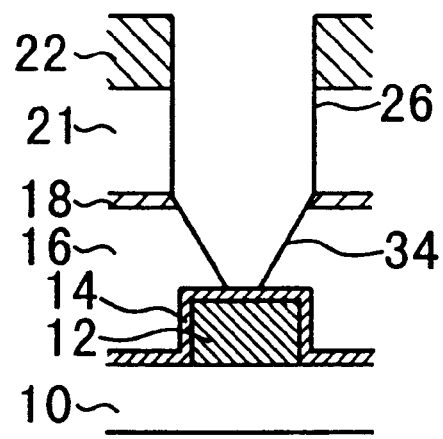

The upper wiring trench 26 is formed on the upper insulating film 21 by means of dry etching (see FIG. 3D) under the same conditions as those employed in the first embodiment and shown in FIG. 1C. During the course of the dry etching process, the connection preparation hole 34 is expanded toward the connection hole stopper film 14 as well as the portion of the same positioned below the upper wiring trench stopper film 18 is tapered in association with the progress of formation of the upper wiring trench 26. As a result, as shown in FIG. 3D, there is formed the connection preparation hole 34 comprising the upper wiring trench 26 and the tapered portion downwardly extending from the lower end of the upper wiring trench 26 toward the connection hole stopper film 14.

By means of the foregoing processing processes, the lower insulating film 16 can be exposed to a dry etching process while protecting the connection hole stopper film 14 from dry etching. Therefore, compared with the method according to the first embodiment, the method according to the third embodiment enables provision of a large process margin and a reduction in the thickness of the connection hole stopper film 14, as in the case with the method according to the second embodiment.

Compared with the methods according to the first and second embodiments, the manufacturing method according to the third embodiment requires a shallow depth for the connection preparation hole 34 in the initial stage, and hence the resist mask 20 (shown in FIG. 3B) which is to be used for forming the connection preparation hole 34 in the third embodiment can be made thinner than that used in the first or second embodiment. The accuracy of the resist mask can be increased as the thickness of the mask becomes thinner. Accordingly, under the manufacturing method according to the third embodiment, the resist mask 20 can be readily formed with higher accuracy.

Under the manufacturing method according to the third embodiment, the depth required by the connection preparation hole 34 in the initial stage—particularly, a depth required for an underlying layer of the upper wiring trench stopper film 18—is shallower than that required in the first or second embodiment. Consequently, the upper insulating film 21 can be made thicker than that formed in the first or second embodiment. Because the upper insulating film 21 can be made thicker, the upper wiring trench 26 can be formed to a greater depth. The interlayer capacitance of the semiconductor device can be made smaller as the thickness of the wiring pattern increases; namely, the depth of a wiring trench becomes deeper. Therefore, the manufacturing method according to the third embodiment is superior to the manufacturing method according to the first or second embodiment in terms of a reduction in the interlayer capacitance of the semiconductor device.

After completion of tapering of the connection preparation hole 34, the silicon substrate is subjected to processing steps analogous to those performed in the first embodiment, i.e., the processing steps shown in FIGS. 1D and 1E. After completion of the foregoing processing steps, there is formed a multilayer wiring structure in which superior conductivity is established between the lower wiring pattern 12 and the upper wiring pattern 38 by way of the tapered connecting section 36.

Fourth Embodiment

A fourth embodiment of the present invention will now be described by reference to FIGS. 4A to 4E.

FIGS. 4A to 4E are cross-sectional views for describing a method of manufacturing a semiconductor device according to the fourth embodiment. In FIGS. 4A to 4E, reference numeral 42 designates an insulating film, and the elements assigned the reference numerals provided in FIGS. 1A to 1E represent elements identical those shown in FIGS. 1A to 1E.

Figure 4A:
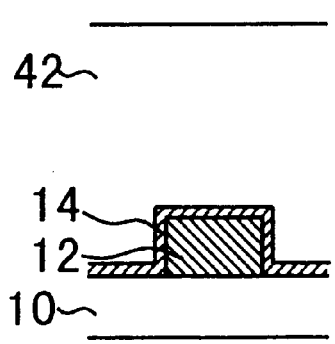
FIGS. 4A through 4E are cross-sectional views for describing a manufacturing method of a semiconductor device according to a fourth embodiment of the present invention.
Figure 4D:
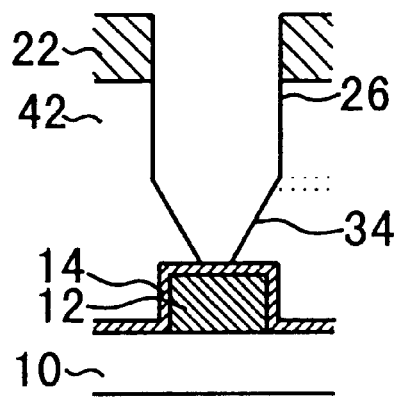

Under the manufacturing method according to the fourth embodiment, after the formation of the connection hole stopper film 14 which covers the lower wiring pattern 12 formed on the interlayer insulating film 10, the insulating film 42 is formed on the connection hole stopper film 14 (FIG. 4A).

The resist mask 20 is formed on the insulating film 42 by means of photolithography. Through dry etching, the connection preparation hole 34 is formed so as to reach a position spaced a given distance away from the connection hole stopper film 14, i.e., an intermediate position in the insulating film 42 (see FIG. 4B). The insulating film 42 is exposed to dry etching in an ECR-type RIE system through use of plasmas consisting of a mixed gas of $C_4F_8+O_2$. Preferably, the depth of the connection preparation hole 34 formed during this process is set to a relevant depth according to the depth of the upper wiring trench 26 to be formed later. Desirably, the bottom of the connection preparation hole 34 is positioned between the bottom of the upper wiring trench 26 and the surface of the connection hole stopper film 14.

Figure 4B:
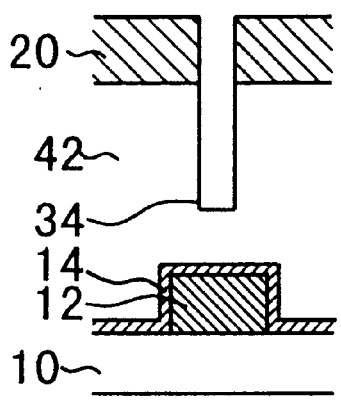
Figure 4E:
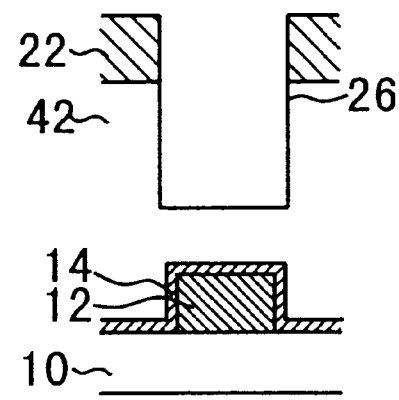
Figure 4C:
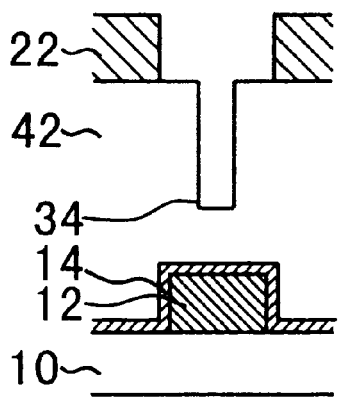

After formation of the connection preparation hole 34 shown in FIG. 4B, the resist mask 20 is removed by ashing. Subsequently, the resist mask 22 is formed on the insulating film 42. The resist mask 22 is patterned in such a way that an opening is formed in a portion of the resist mask 22 corresponding to the area including the connection preparation hole 34 (see FIG. 4C). After formation of the resist mask 22, the upper wiring trench 26 is formed in the insulating film 42 by means of dry etching (see FIG. 4D).

The insulating film 42 is exposed to a dry etching process through use of plasmas consisting of a mixed gas of $C_4F_8$+ $CHF_3$+$O_2$. During the course of formation of the upper wiring trench 26, the lower end of the connection preparation hole 34 is expanded toward the connection hole stopper film 14. Further, the diameter of the connection preparation hole 34 is gradually increased from an area in the vicinity of the upper edge of the connection preparation hole 34.

As a result of the foregoing etching process, there is formed the connection preparation hole 34 comprising the upper wiring trench 26 and a tapered portion downwardly extending from the lower end of the upper wiring trench 26 to the connection hole stopper film 14. Under the foregoing etching conditions, the bottom of the upper wiring trench 26 where the connection preparation hole 34 is not provided can be etched without causing a trenching phenomenon. Accordingly, even though the stopper film is not used, the upper wiring trench 26 having a relevant shape can be formed by subjecting the insulating film 42 to a dry etching process until the depth of the concave portion formed by the etching reaches a desired depth which is required to the trench 26 (see FIG. 4E).

Under the manufacturing method according to the fourth embodiment, the dry etching process for forming the tapered connection preparation hole 34 is executed while the connection hole stopper film 14 is protected by the insulating film 42. Therefore, compared with the method according to the first embodiment, the method according to the fourth embodiment enables provision of a large process margin and a reduction in the thickness of the connection hole stopper film 14, as in the case with the methods according to the second and third embodiments. Further, the manufacturing method according to the fourth embodiment enables omission of the upper trench stopper film, thereby resulting in a reduction in the number of processing steps and the interlayer capacitance. In terms of a reduction in the manufacturing cost and improvements in the yield and performance of the semiconductor device, the manufacturing method according to the fourth embodiment is superior to the manufacturing methods defined in the first through third embodiments.

After completion of tapering of the connection preparation hole 34, the silicon substrate is exposed to the same processing steps as those to which the silicon substrate is subjected in the first embodiment. More specifically, the silicon substrate is exposed to the processing steps shown in FIGS. 1D and 1E. After completion of the forgoing processing steps, a multilayer structure is formed in the semiconductor device, wherein good continuity is established between the lower wiring pattern 12 and the upper wiring pattern 38 by way of the tapered connecting section 36.

Fifth Embodiment

A fifth embodiment of the present invention will now be described by reference to FIGS. 5A to 6D.

FIGS. 5A to 6D are cross-sectional views for describing a method of manufacturing a semiconductor device according to the fifth embodiment. In FIGS. 5A to 6D, those elements assigned the same reference numerals provided in FIGS. 1A to 1E represent elements identical those shown in FIGS. 1A to 1E.

Under the manufacturing method according to the fifth embodiment, a trench to be used for forming the lower wiring pattern 12 is patterned in the interlayer insulating film 10. Next, an alloy of AlCu or metallic material such as Cu, i.e., conductive material, is deposited in the trench patterned in the interlayer insulating film 10 and on the interlayer insulating film 10 by means of CVD, plating, or sputtering. The thus-deposited conductive material is back-polished through CMP, thus resulting in formation of the lower wiring pattern 12.

A first stopper film 44 is then formed on the lower wiring pattern 12. During the course of an etching process in which there is formed a connection hole for electrically connecting the lower wiring pattern 12 to an upper wiring pattern, the first stopper film 44 acts as a stopper film. According to the fifth embodiment, the interlayer insulating film 10 is formed from a silicon oxide film, and the first stopper film 44 is formed from a silicon nitride film which is likely to ensure high etch selective ratio with respect to a silicon oxide film.

Figure 5A:
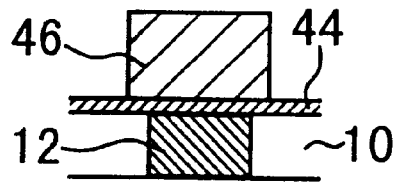
FIGS. 5A through 5D and 6A through 6D are cross-sectional views for describing a manufacturing method of a semiconductor device according to a fifth embodiment of the present invention.
Figure 5B:
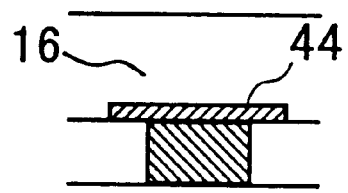
Figure 5C:
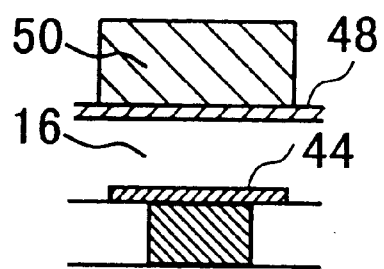
Figure 5D:
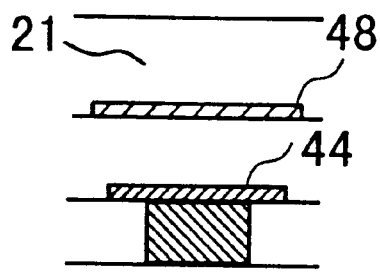

A resist pattern 46 is formed on the first stopper film 44 by means of photolithography. The resist pattern 46 has a width greater than that of the lower wiring pattern 12 and has an identical pattern with that of an upper wiring to be formed later (FIG. 5A). Further, the resist pattern 46 is positioned in such a way that neither edge of the resist pattern 46 is not situate between the edges of the lower wiring pattern 12.

The first stopper film 44 is patterned by means of dry etching while the resist pattern 46 is used as a mask. The resist pattern 46 is then removed, and the lower insulating film 16 is formed on the first stopper film 44. More specifically, the lower insulating film 16 is formed from a silicon oxide film having a low dielectric constant, such as a SiOx film prepared through plasma CVD or a fluorine-based silicon oxide film (SiOxFy).

A second stopper film 48 is formed on the lower dielectric film 16. As in the case with the first stopper film 44, the second stopper film 48 is formed from a silicon nitride film which is apt to ensure high etch selective ratio with respect to a silicon oxide film. A resist pattern 50 is formed on the second stopper film 48 by means of photolithography. The resist pattern 50 has a width greater than that of an upper wiring to be formed later and has an identical pattern with that of the upper wiring (see FIG. 5C).

After formation of the resist pattern 50, the second stopper film 48 is patterned by means of dry etching while the resist pattern 50 is used as a mask. Subsequently, the upper insulating film 21 is formed on the second stopper film 48 (see FIG. 5D) from a silicon oxide film having a low dielectric constant as in the case of the lower insulating film 16.

Figure 6A:
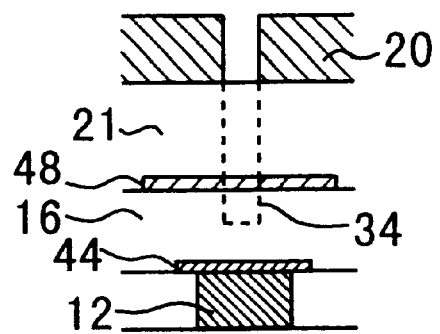
Figure 6B:
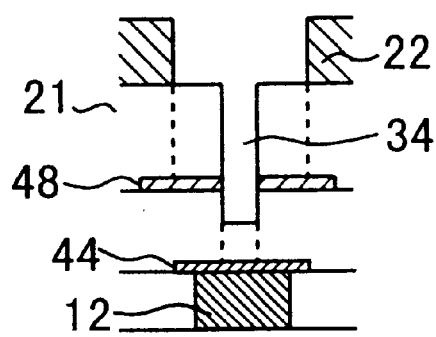
Figure 6C:
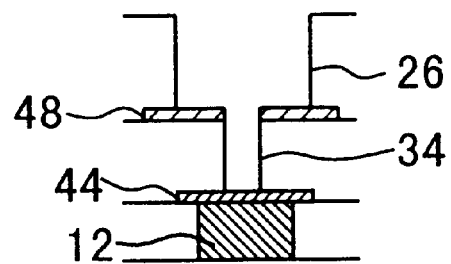

The resist mask 20 is formed on the upper insulating film 21 by means of photolithography (see FIG. 6A). While the resist mask 20 is used as a mask, the silicon substrate is exposed to a dry etching process. As a result of the dry etching process, there is formed the connection preparation hole 34 which penetrates through the upper insulating film 21 and the second stopper film 48 and extends to an intermediate position in the lower insulating film 16. More specifically, the concentration preparation hole 34 is formed so as to reach a substantially center position in the thicknesswise direction of the lower insulating film 16.

After formation of the connection preparation hole 34, the resist mask 20 is removed. In place of the resist mask 20, the upper trench resist mask 22 is formed on the upper insulating film 21 (see FIG. 6B).

Subsequently, while the upper trench resist mask 22 is used as a mask, the silicon substrate is exposed to a dry etching process on condition that a silicon oxide film can be removed with high selective ratio with respect to the silicon nitride film. The silicon substrate is continually subjected to the dry etching process until the second stopper film 48 becomes exposed in the upper wiring trench 28 and the first stopper film 44 becomes exposed in the connection preparation hole 34 (see FIG. 6C).

Figure 6D:
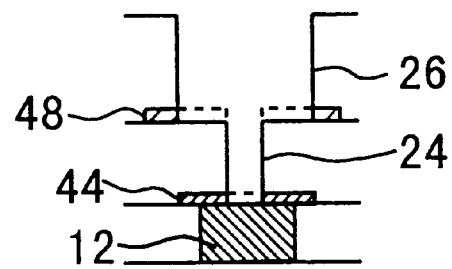

Through dry etching, the remaining second stopper film 48 is removed from the bottom of the upper wiring trench 26, and the remaining first stopper film 44 is removed from the bottom of the connection preparation hole 34 (see FIG. 6D).

As in the case with the first embodiment, conductive material is deposited in the connection hole 24 and the upper wiring trench 26, thereby resulting in formation of a desired multilayer wiring structure.

As mentioned above, under the manufacturing method according to the fifth embodiment, each of a silicon nitride film (i.e., the first stopper film 44) which acts as an etch stopper during the course of formation of the connection hole 24 and a silicon nitride film (i.e., the second stopper film 48) which acts as an etch stopper film during the course of formation of the upper wiring trench 26 is patterned on a minimum required area. Therefore, under the manufacturing method according to the fifth embodiment, the amount of silicon nitride film left in the semiconductor device can be sufficiently reduced.

The smaller the amount of silicon nitride film left in the semiconductor device, the smaller the interlayer capacitance of the semiconductor device. Further, the smaller the interlayer capacitance, the more apt the semiconductor device is to operate faster. For these reasons, under the manufacturing method according to the fifth embodiment, a multilayer wiring structure can be accurately formed through use of a stopper film, and a superior high-speed operation characteristic can be imparted to the silicon substrate.

Although in the fifth embodiment conductive sections formed on and below the connection hole 24 are wiring patterns, the conductive sections are not limited to wiring patterns; for example, a storage node may be formed as a conductive section on the one end of the connection hole 24.

Sixth Embodiment

A sixth embodiment of the present invention will now be described by reference to FIGS. 7A to 8D.

FIGS. 7A to 8D are cross-sectional views for describing a method of manufacturing a semiconductor device according to the sixth embodiment. In FIGS. 7A to 8D, those elements assigned the same reference numerals provided in FIGS. 1A to 1E or FIGS. 5A to 6D represent elements identical those shown in the figures.

Under the manufacturing method according to the sixth embodiment, a trench to be used for forming the lower wiring pattern 12 is patterned on the interlayer insulating film 10. Next, an alloy of AlCu or metallic material such as Cu, i.e., conductive material, is deposited in the trench patterned in the interlayer insulating film 10 and on the interlayer insulating film 10 by means of CVD, plating, or sputtering. The thus-deposited conductive material is back-polished through CMP, thus resulting in formation of the lower wiring pattern 12.

The first stopper film 44 is then formed on the lower wiring pattern 12. During the course of an etching process in which there is formed a connection hole for electrically connecting the lower wiring pattern 12 to an upper wiring pattern, the first stopper film 44 acts as a stopper film.

Subsequently, the lower insulating film 16 is formed on the first stopper film 44. More specifically, the lower insulating film 16 is formed from a silicon oxide film having a low dielectric constant, such as a SiOx film prepared through plasma CVD or a fluorine-based silicon oxide film (SiOxFy).

Figure 7A:
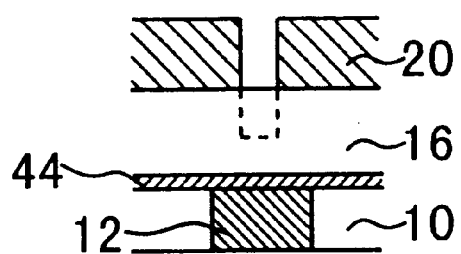
FIGS. 7A through 7D and 8A through 8D are cross-sectional views for describing a manufacturing method of a semiconductor device according to a sixth embodiment of the present invention.
Figure 7B:
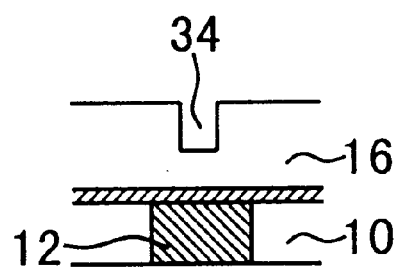

Then, the resist mask 20 is formed on the lower insulating film 16 by means of photolithography (see FIG. 7A).

While the resist mask 20 is used as a mask, the silicon substrate is subjected to a dry etching process for the purpose of preparing the connection preparation hole 34. The etching process is performed until the connection preparation hole 34 reaches an intermediate position in the lower insulating film 16;—more specifically a position about 80% through the thickness of the lower insulating film 16. After formation of the connection preparation hole 34, the resist mask 20 is removed (see FIG. 7B).

A silicon nitride film 52 such as a p-SiN film formed by means of plasma CVD is formed from to a predetermined thickness on the interior of the connection preparation hole 34 formed to a depth of about 80% through the thickness of the lower insulating film 34, as well as on the lower insulating film 16.

Subsequently, a resist pattern 54 identical in pattern with an upper wiring pattern to be formed later is formed on the silicon nitride film 52 by means of photolithography (see FIG. 7C).

Subsequently, while the resist pattern 54 is used as a mask, the silicon nitride film 52 is patterned by means of anisotropic etching. As a result, a silicon nitride film-pattern 55 identical in pattern with an upper wiring pattern is formed on the lower insulating film 16 (see FIG. 7D).

Figure 8A:
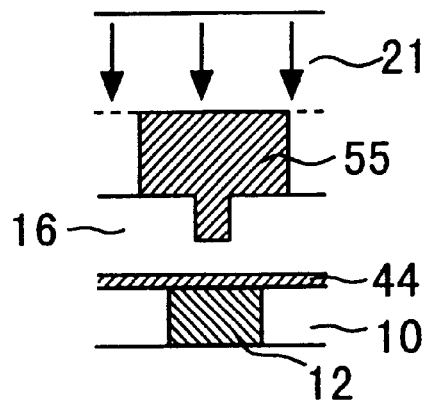

The upper insulating film 21 is formed to a sufficient thickness on the lower insulating film 16 and the silicon nitride film pattern 55 (see FIG. 8A).

Figure 8B:
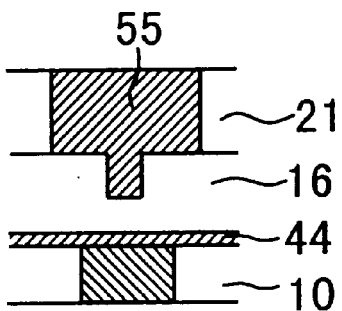

The upper insulating film 21 is abraded and smoothed by means of CMP until the surface of the silicon nitride film pattern 55 becomes exposed and the silicon nitride film pattern 55 has a thickness required for an upper wiring pattern (see FIG. 8B).

Figure 8C:
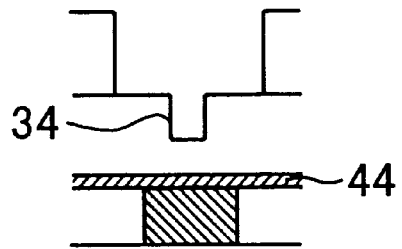
Figure 8D:
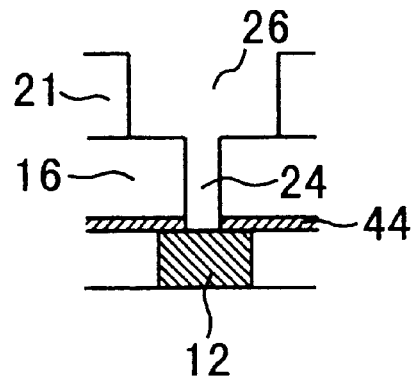

After completion of the abrading and smoothing processes, the silicon nitride film embedded in the connection preparation hole 34 and the upper insulating film 21 is removed through use of a heat phosphoric acid (see FIG. 8C).

The connection preparation hole 34 is expanded until the first stopper film 44 becomes exposed on the bottom of the connection preparation hole 34. Subsequently, the entire surface of the silicon substrate is exposed to an etch back, whereby the exposed first stopper film 44 is removed from the bottom of the connection preparation hole 34. As a result, there are formed the connection section 24 which communicates with the lower wiring pattern 12 as well as the upper wiring trench 26 which communicates with the connection section 24 (see FIG. 8D)

As in the case with the first embodiment, a desired multilayer wiring structure is formed by deposition of conductive material in the connection hole 24 and the upper wiring trench 26.

As mentioned above, under the manufacturing method according to the sixth embodiment, an upper wiring trench can be formed accurately without use of a stopper film. Accordingly, under the manufacturing method according to the sixth embodiment, there can be manufactured a semiconductor device whose interlayer capacitance is significantly reduced compared with that of a semiconductor device in which a stopper film is formed over substantially the entire area of an interlayer insulating film. Further, under the manufacturing method according to the sixth embodiment, the depth of the upper wiring trench 26, i.e., the thickness of an upper wiring pattern to be formed in the upper wiring trench 26 corresponds to the thickness of the silicon nitride film pattern 55 (i.e., the thickness of the pattern 55 after the abrading by CMP). Therefore, under the manufacturing method according to the sixth embodiment, even a stopper film is not used, the thickness of an upper wiring pattern can be accurately controlled by appropriately adjusting the thickness of the silicon nitride film 52.

Although in the sixth embodiment the first stopper film 44 is not patterned, the first stopper film 44 may be patterned into a predetermined shape as in the case with the fifth embodiment. So long as the first stopper film 44 is patterned, the interlayer capacitance of the semiconductor device can be reduced to a much greater extent.

Seventh Embodiment

A seventh embodiment of the present invention will now be described by reference to FIGS. 9A to 10D.

FIGS. 9A to 10D are cross-sectional views for describing a method of manufacturing a semiconductor device according to the seventh embodiment. In FIGS. 9A to 10D, the elements assigned the reference numerals provided in any of FIGS. 1A through 8D represent elements identical those shown in the figures.

Under the manufacturing method according to the seventh embodiment, a trench to be used for forming the lower wiring pattern 12 is patterned in the interlayer insulating film 10. Next, an alloy of AlCu or metallic material such as Cu, i.e., conductive material, is deposited in the trench patterned in the interlayer insulating film 10 and on the interlayer insulating film 10 by means of CVD, plating, or sputtering. The thus-deposited conductive material is back-polished through CMP, thus resulting in formation of the lower wiring pattern 12.

The first stopper film 44 is then formed on the lower wiring pattern 12. During the course of an etching process in which there is formed a connection hole for electrically connecting the lower wiring pattern 12 to an upper wiring pattern, the first stopper film 44 acts as a stopper film.

Subsequently, the lower insulating film 16 is formed on the first stopper film 44. More specifically, the lower insulating film 16 is formed from a silicon oxide film having a low dielectric constant, such as a SiOx film prepared through plasma CVD or a fluorine-based silicon oxide film (SiOxFy) (see FIG. 9A).

By means of plasma CVD, the silicon nitride film 52 is formed from p-SiN to a predetermined thickness on the lower insulating film 16.

Figure 9A:
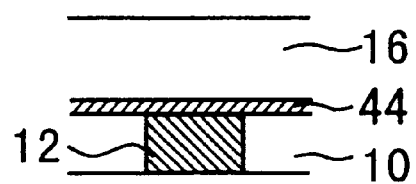
FIGS. 9A through 9D and 10A through 10D are cross-sectional views for describing a manufacturing method of a semiconductor device according to a seventh embodiment of the present invention.
Figure 9B:
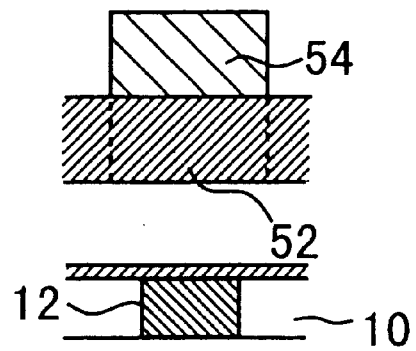

Subsequently, the resist pattern 54 identical in pattern with an upper wiring pattern to be formed later is formed on the silicon nitride film 52 by means of photolithography (see FIG. 9B).

Subsequently, while the resist pattern 54 is used as a mask, the silicon nitride film 52 is patterned by means of anisotropic etching. As a result, the silicon nitride film pattern 55 identical in pattern with an upper wiring pattern is formed on the lower insulating film 16.

Figure 9C:
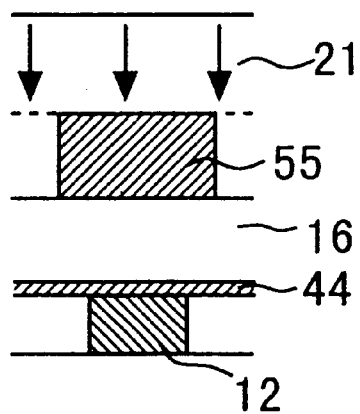

The upper insulating film 21 is formed to a sufficient thickness on the lower insulating film 16 and the silicon nitride film pattern 55 (see FIG. 9C).

Figure 9D:
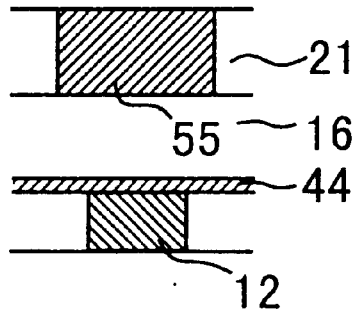

The upper insulating film 21 is abraded and smoothed by means of CMP until the surface of the silicon nitride film pattern 55 becomes exposed and the silicon nitride film pattern 55 attains the thickness required for an upper wiring pattern (see FIG. 9D).

Figure 10A:
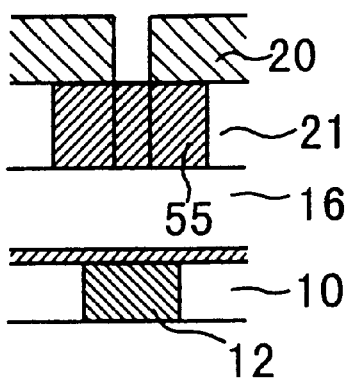

The resist mask 20 is formed on the silicon nitride film pattern 55 by means of photolithography (see FIG. 10A).

Figure 10B:
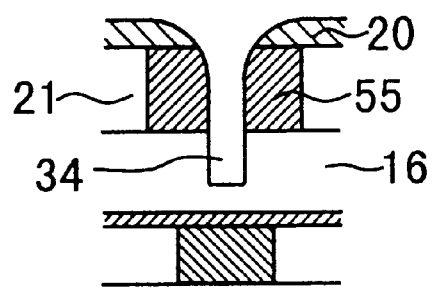

While the resist mask 20 is used as a mask, the silicon substrate is subjected to a dry etching process, thereby resulting in formation of the connection preparation hole 34 that penetrates through the silicon nitride film 55 and that reaches a position in the lower insulating film 16;—more specifically, a position about 80% through the thickness of the lower insulating film 16—(see FIG. 10B).

Figure 10C:
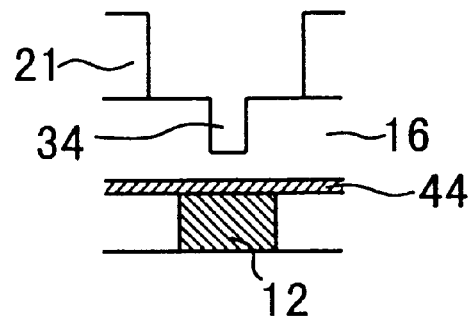
Figure 10D:
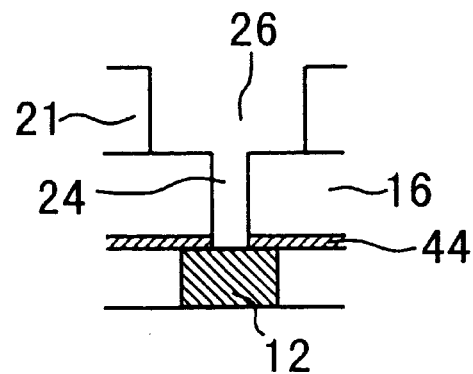

After completion of the abrading and smoothing processes, the silicon nitride film embedded in the connection preparation hole 34 and the upper insulating film 21 is removed through use of a heat phosphoric acid (see FIG. 10C).

The connection preparation hole 34 is expanded until the first stopper film 44 becomes exposed on the bottom of the connection preparation hole 34.

Subsequently, the entire surface of the silicon substrate is exposed to an etch back, whereby the exposed first stopper film 44 on the bottom of the connection preparation hole 34 is removed. As a result, there are formed the connection section 24 which is in communication with the lower wiring pattern 12 as well as the upper wiring trench 26 which is in communication with the connection section 24 (see FIG. 10D).

As in the case with the first embodiment, a desired multilayer wiring structure is formed by deposition of conductive material in the connection hole 24 and the upper wiring trench 26.

Under the manufacturing method according to the seventh embodiment, as in the case with the sixth embodiment, the interlayer capacitance of the semiconductor device can be reduced, and the thickness of an upper wiring pattern can be accurately controlled without using a stopper film.

Figure 7C:
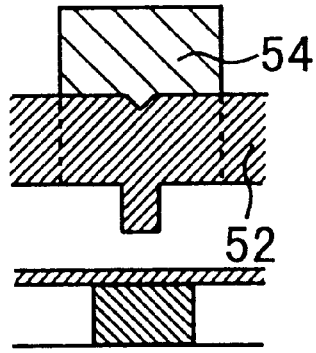
Figure 7D:
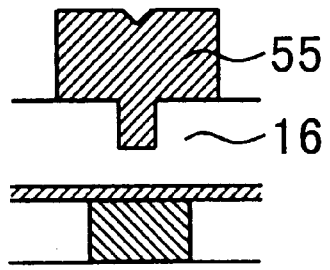

Under the manufacturing method according to the sixth embodiment, if the connection hole is significantly out of alignment with the upper wiring pattern, the edges of the resist pattern 54 shown in FIG. 7C may overlap the area of the connection preparation hole 34. If the etching of the silicon nitride film 52 is executed under the situation discussed above, even the silicon nitride film 52 provided in the connection preparation hole 34 is eliminated during the course of etching. In this case, an insulating film (e.g., an oxide film) enters the interior of the connection preparation hole 34, thus finally preventing formation of the connection hole 24 into a desired pattern.

In contrast, under the manufacturing method according to the seventh embodiment, if the connection hole is significantly out of alignment with the upper wiring pattern and if the opening of the resist mask 20 shown in FIG. 10A overlaps the edges of the silicon nitride film pattern 55, the insulating film (e.g., an oxide film) will not enter the interior of the connection preparation hole 34. Therefore, under the manufacturing method according to the seventh embodiment, even in the foregoing case, the connection hole 24 may be formed into a desired pattern, and there may be formed a multilayer wiring structure having a superior conductive characteristic. The manufacturing method according to the seventh embodiment is superior to that according to the sixth embodiment in terms of the foregoing points.

Although in the seventh embodiment the first stopper film 44 is not patterned, the first stopper film 44 may be patterned into a predetermined shape as in the case with the fifth embodiment. So long as the first stopper film 44 is patterned, the interlayer capacitance of the semiconductor device can be reduced to a much greater extent.

Eighth Embodiment

An eighth embodiment of the present invention will now be described by reference to FIGS. 11A and 11B.

Figure 11A:
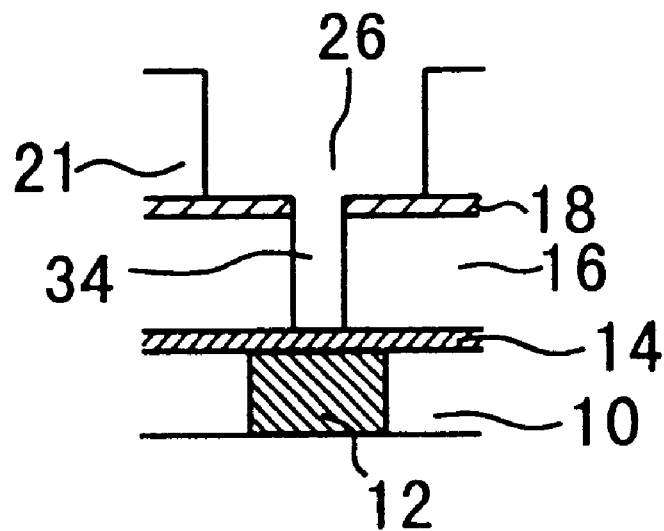
FIGS. 11A and 11B are cross-sectional views for describing a manufacturing method of a semiconductor device according to a eighth embodiment of the present invention.
Figure 11B:
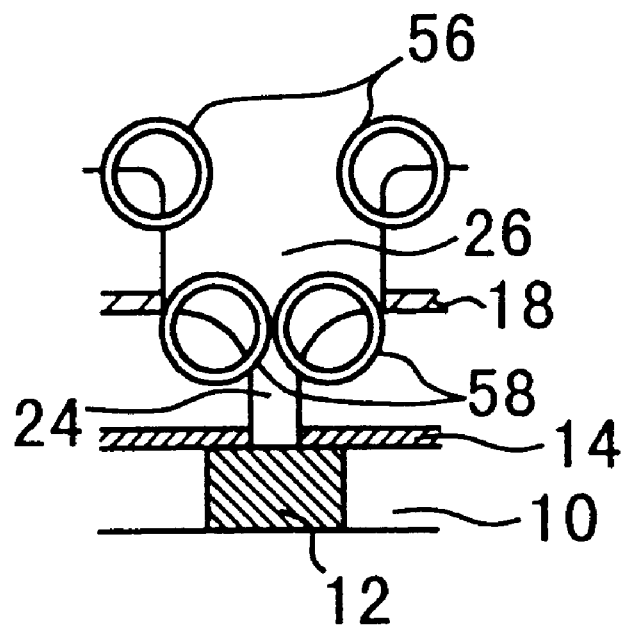

FIGS. 11A and 11B are cross-sectional views for describing a manufacturing method according to the eighth embodiment. In FIGS. 11A to 11B, those elements assigned the same reference numerals provided in any of FIGS. 1A through 1E represent elements identical those shown in the figures.

Figure 16A:
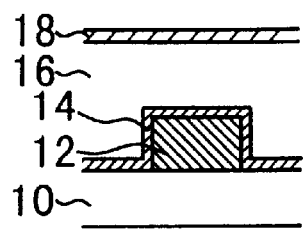
FIGS. 16A through 16F are cross-sectional views for describing a first example of a former manufacturing method of a semiconductor device.
Figure 16B:
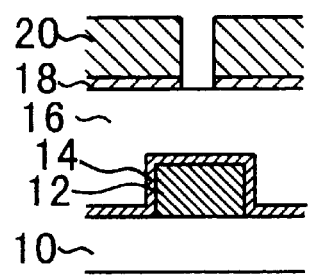
Figure 16C:
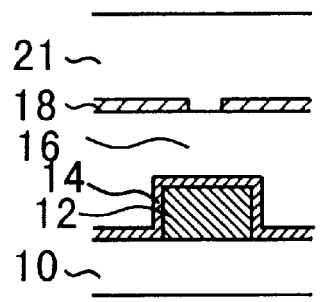
Figure 16D:
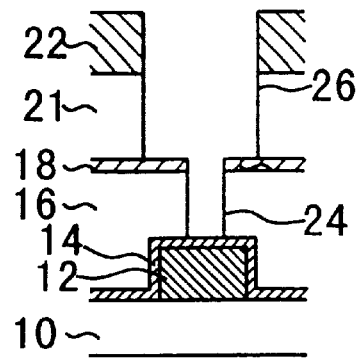
Figure 16E:
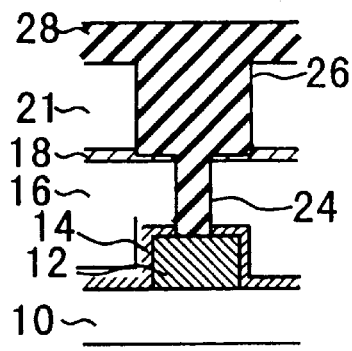
Figure 16F:
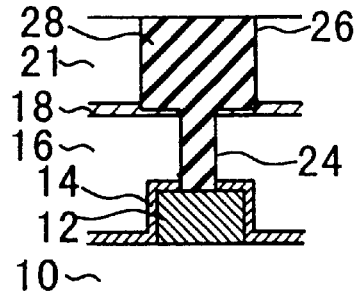
Figure 17A:
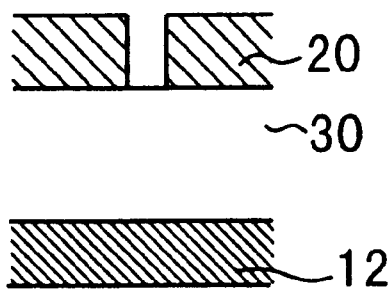
FIGS. 17A through 17D and 18A through 18D are cross-sectional views for describing a second example of a former manufacturing method of a semiconductor device.
Figure 17B:
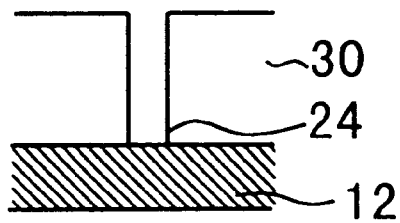
Figure 17C:
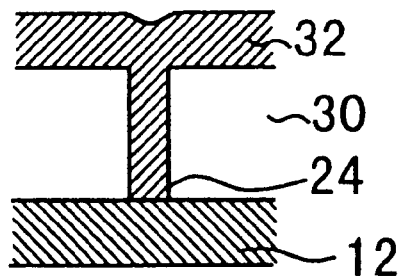
Figure 17D:
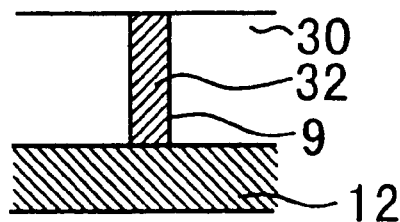
Figure 18A:
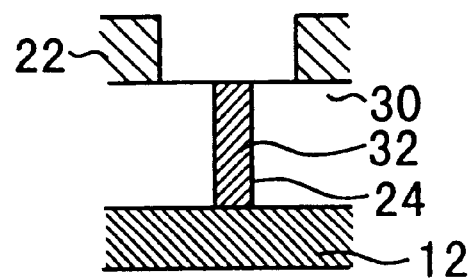
Figure 18B:
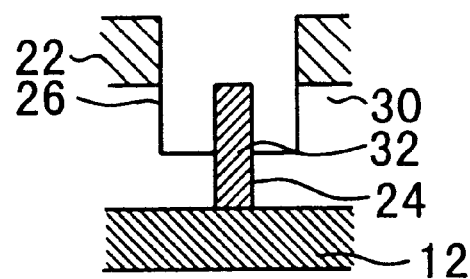
Figure 18C:
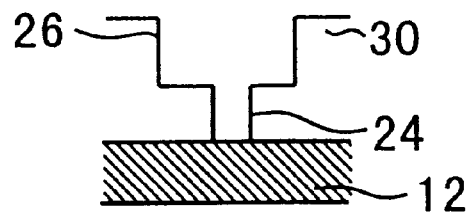
Figure 18D:
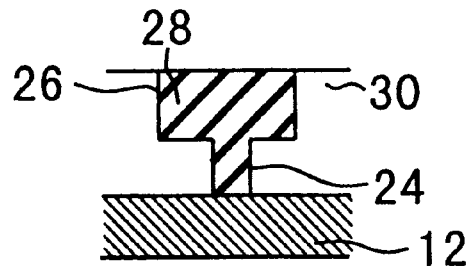

Under the manufacturing method according to the eighth embodiment, the upper wiring trench 26 and the connection preparation hole 34 are formed on the semiconductor substrate by means of a former damascene method (see FIG. 11A). More specifically, as shown in FIGS. 16A through 16D, the upper wiring trench 26 and the connection preparation hole 34 are formed through the following processing steps:

(1) the lower wiring pattern 12 is formed on the interlayer insulating film 10;

(2) the connection hole stopper film 14 is formed so as to cover the lower wiring pattern 12;

(3) the lower insulating dielectric film 16 and the upper trench stopper film 18 are formed on the connection hole stopper film 14, in this sequence (see FIG. 16A);

(4) the resist mask 20 is formed on the upper trench stopper film 18 by means of photolithography;

(5) an opening in the upper trench stopper film 18 is formed by means of dry etching (see FIG. 16B);

(6) the upper insulating film 21 is formed on the upper stopper film 18 after removal of the resist mask 20 (see FIG. 16C);

(7) the upper trench resist mask 22 is formed on the upper insulating film 21 by means of. photolithography; and (8) the upper wiring trench 26 is formed in the upper insulating film 21 by means of dry etching and the connection preparation hole 34 (corresponding to the connection hole 24 shown in FIG. 16D) is simultaneously formed in a self-aligned manner (see FIG. 16D).

Next, the exposed connection hole stopper film 14 in the connector preparation hole 34 and the exposed upper trench stopper film 18 in the upper wiring trench 24 are removed through dry etching. Under manufacturing method according to the eighth embodiment, the dry etch operation is performed through use of a gas chiefly containing an inactive gas;—more preferably, a gas containing an inactive gas in an amount of 80% or more—. This gas enables an etching effect stemming from physical action to increase with respect to an etching effect stemming from chemical action. An increase in the voltage applied to the cathode of the sputtering system is also effective for increasing the sputtering effect of the dry etching process.

By means of the foregoing dry etching process (sputter etching process), a protruding angular area is etched faster than is a flat area. Therefore, if a semiconductor substrate shown in FIG. 11A is subjected to the foregoing dry etching process, angular portions 56 along the upper edge of the upper wiring trench 26 and angular portions around the upper edge of the connection preparation hole 34 are etched to a greater depth than are the other portions of the semiconductor substrate. As a result, these angular portions become drooped, and there is formed the connection hole 24 upwardly tapered in such a way as to have a smaller diameter in the vicinity of the lower wiring pattern 12 and a larger diameter in the vicinity of the upper wiring trench 26 (see FIG. 11B).

As in the case with the first embodiment, a desired multilayer wiring structure is formed by deposition of conductive material in the connection hole 24 and the upper wiring trench 26.

As mentioned above, under the manufacturing method according to the eighth embodiment, the upper edge of each of the connection hole 24 and the upper wiring trench 26 can be broadened at the time of removal of the connection hole stopper film 14 and the upper trench stopper film 18 by means of dry etching. For this reason, under the eighth embodiment, barrier metal or metal wiring material may be readily embedded into the connection hole 24 or the upper wiring trench 26.

According to the eighth embodiment, if the connection hole 24 is significantly out of alignment with the lower wiring pattern 12, the connection hole 24 may be located in a portion including the boundary region between the lower wiring pattern 12 and the interlayer insulating film 10. Under such a circumstance, if the connection hole stopper film 14 is removed by means of dry etching accompanied by chemical reaction, the interlayer insulating film 10 is trenched to a great depth during the course of an over etch process after removal of the connection hole stopper film 14. In contrast, the eighth embodiment executes the dry etching so that the chemical reaction stemming from the etching (primarily an ion assisted reaction) is minimized, thus preventing excessive trenching of the interlayer insulating film 10. For this reason, under the manufacturing method according to the eighth embodiment, a multilayer wiring structure having stable quality can be manufactured at high yield.

Ninth Embodiment

A ninth embodiment of the present invention will now be described by reference to FIGS. 12A to 13D.

FIGS. 12A to 13D are cross-sectional views for describing a method of manufacturing a semiconductor device according to the ninth embodiment. In FIGS. 12A to 13D, those elements assigned the reference numerals provided in any of FIGS. 1A through 11B represent elements identical those shown in the figures.

Under the manufacturing method according to the ninth embodiment, a trench to be used for forming the lower wiring pattern 12 is patterned in the interlayer insulating film 10. Next, an alloy of AlCu or metallic material such as Cu, i.e., conductive material, is deposited in the trench patterned in the interlayer insulating film 10 and on the interlayer insulating film 10 by means of CVD, plating, or sputtering. The thus-deposited conductive material is back-polished through CMP, thus resulting in formation of the lower wiring pattern 12.

The connection hole stopper film 14 is then formed on the lower wiring pattern 12. During the course of an etching process in which there is formed a connection hole for electrically connecting the lower wiring pattern 12 to an upper wiring pattern, the connection hole stopper film 14 acts as a stopper film.

Subsequently, the lower insulating film 16 is formed on the connection hole stopper film 14. More specifically, the lower insulating film 16 is formed from a silicon oxide film having a low dielectric constant, such as a SiOx film prepared through plasma CVD or a fluorine-based silicon oxide film (SiOxFy) (see FIG. 12A).

A resist pattern 60 is formed on the lower insulating film 16 by means of photolithography. The resist pattern 60 is then patterned in such a way that an opening is formed at the location where the connection hole 24 is to be formed.

The resist pattern 60 is immersed into a hydrofluoric acid together with the semiconductor substrate. As a result, the area of the lower insulating film 16 in the vicinity of the opening of the resist pattern 60 is isotropically etched, thereby resulting in formation of a recess 62 in the area of the lower insulating film 16 where the connection hole 24 is to be formed (see FIG. 12B).

Figure 12A:
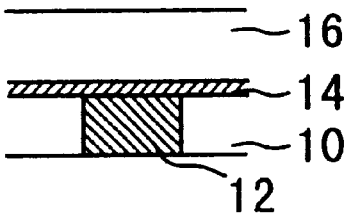
FIGS. 12A through 12D and 13A through 13D are cross-sectional views for describing a manufacturing method of a semiconductor device according to a ninth embodiment of the present invention.
Figure 12B:
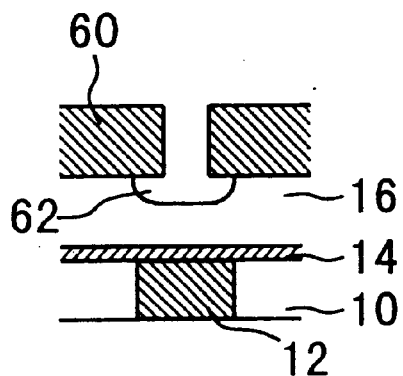
Figure 12C:
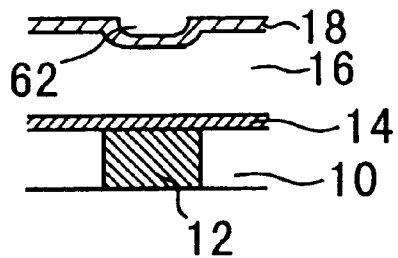

After removal of the resist pattern 60, the upper trench stopper film 18 is formed on the lower insulating film 16 (see FIG. 12C).

Figure 12D:
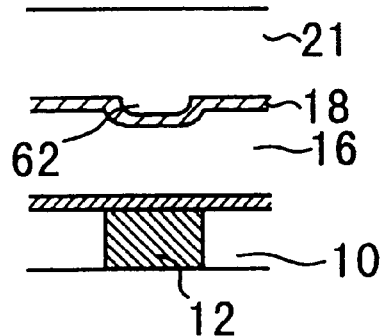

The upper insulating film 21 is further formed on the upper trench stopper film 18 (see FIG. 12D).

Figure 13A:
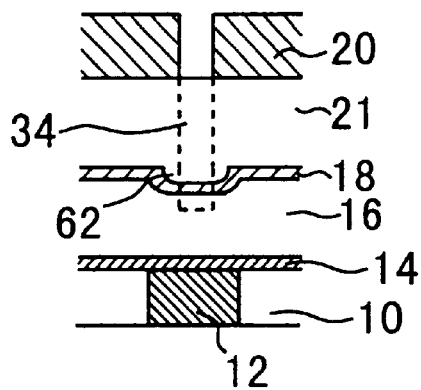

The resist mask 20 is formed on the upper insulating film 21 by means of photolithography (see FIG. 13A).

Subsequently, the semiconductor substrate is exposed to a dry etching process while the resist mask 20 is used as a mask under a condition in which the silicon oxide film does not have a high etch selective ratio with respect to the silicon nitride film; namely, the upper and lower insulating films 21 and 16 do not have a high etch selective ratio with regard to the upper trench stopper film 18. As a result of the dry etching, there is formed the connection preparation hole 34 which penetrates through the upper insulating film 21 and the upper trench stopper film 18 and which reaches an intermediate position in the lower insulating film 16, more particularly, a position at about half of the way through the thickness of the lower insulating film 16 (see FIG. 13B).

Figure 13B:
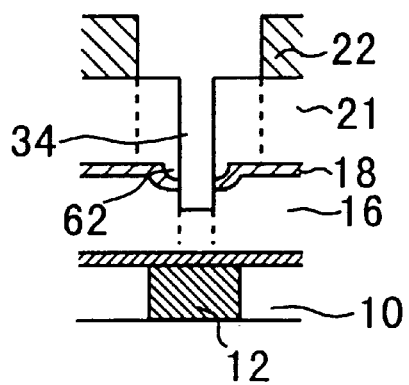
Figure 13C:
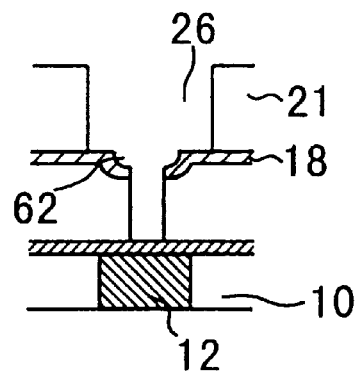

After removal of the resist mask 20, the upper trench resist mask 22 is formed on the upper insulating film 21 by means of photolithography (see FIG. 13B).

The semiconductor substrate is then subjected to a dry etching process while the upper trench resist mask 22 is used as a mask, on condition that the silicon oxide film is eliminated with a comparatively high etch selective ratio with respect to the silicon nitride film. The dry etching process is performed such that the upper wiring trench 26 reaches the upper trench stopper film 18 and that the half-opened connection preparation hole 34 reaches the connection hole stopper film 14 (see FIG. 13C).

Figure 13D:
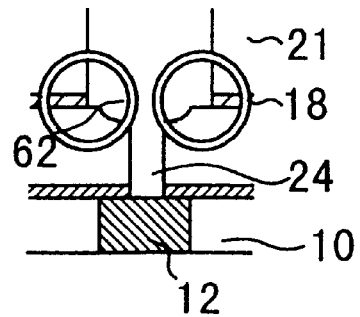

The exposed upper trench stopper film 18 in the upper wiring trench 26 and the exposed connection hole stopper film 14 in the connection preparation hole 34 are removed through dry etching (FIG. 13D).

As in the case with the first embodiment, a desired multilayer wiring structure is formed by deposition of conductive material in the connection hole 24 and the upper wiring trench 26.

As mentioned above, under the manufacturing method according to the ninth embodiment, the recess 62 can be formed along the upper edge of the connection hole 24; namely, a large opening area can be ensured in the vicinity of the upper edge of the connection hole 24. Accordingly, under the ninth embodiment, barrier metal or metal wiring material maybe readily embedded into the connection hole 24.

Tenth Embodiment

A tenth embodiment of the present invention will now be described by reference to FIGS. 14A to 15D.

FIGS. 14A to 15D are cross-sectional views for describing a method of manufacturing a semiconductor device according to the tenth embodiment. In FIGS. 14A to 15D, the elements assigned the same reference numerals provided in any of FIGS. 1A through 13D represent elements identical those shown in the figures.

Figure 14A:
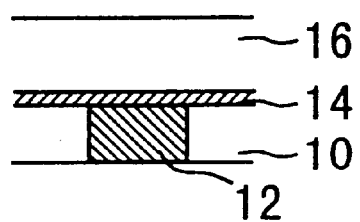
FIGS. 14A through 14D and 15A through 15D are cross-sectional views for describing a manufacturing method of a semiconductor device according to a tenth embodiment of the present invention.
Figure 14B:
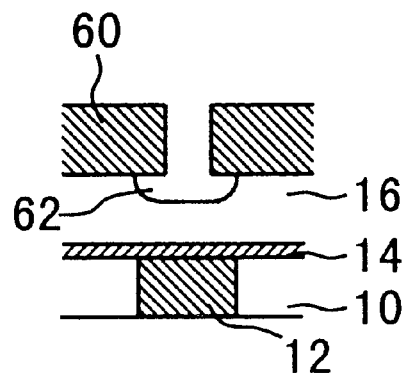

FIGS. 14A and 14B correspond to FIGS. 12A and 12B referred to in description of the ninth embodiment. More specifically, under the manufacturing method according to the tenth embodiment, the semiconductor substrate is subjected to processing steps identical with those carried out in the ninth embodiment, whereby there is obtained a semiconductor substrate such as that shown in FIG. 14B.

Figure 14C:
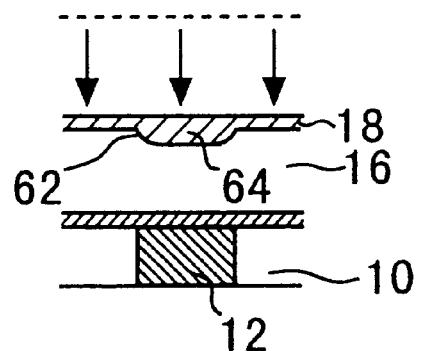

After the semiconductor device shown in FIG. 14B has been obtained, the resist pattern 60 is removed and the upper trench stopper film 18 is formed on the lower insulating film 16 (see FIG. 14C). Under the manufacturing method according to the tenth embodiment, the upper trench stopper film 18 is formed by (1) sufficiently growing a silicon nitride film with respect to the depth of a recess 62 of the lower insulating film 16, and (2) abrading and smoothing the silicon nitride film by means of CMP in such a way as to impart the silicon nitride film with a desired thickness in regions other than the recess 62. Through the foregoing processing operations, there is formed the upper trench stopper film 18, wherein a protuberance 64 having a thickness greater than that of the other regions is formed in the recess 62.

Figure 14D:
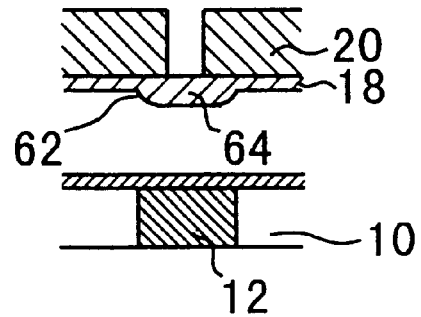

Subsequently, the resist mask 20 is formed in the upper trench stopper film 18 by means of photolithography (see FIG. 14D).

While the resist mask 20 is used as a mask, the semiconductor substrate is subjected to a dry etching process for the purpose of forming the connection preparation hole 34 which penetrates through the protuberance 64 of the upper trench stopper film 18.

Figure 15A:
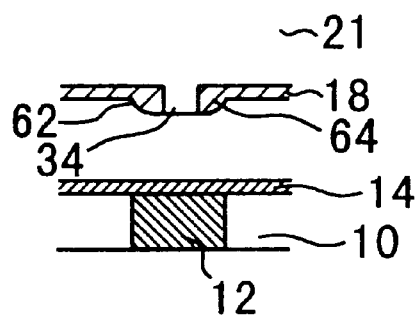

After removal of the resist mask 20, the upper insulating film 21 is formed on the interior of the connection preparation hole 34 and on the upper trench stopper film 18 (see FIG. 15A).

Figure 15B:
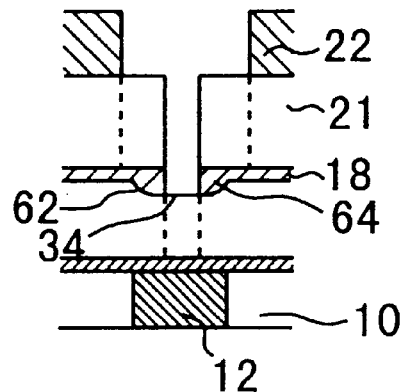
Figure 15C:
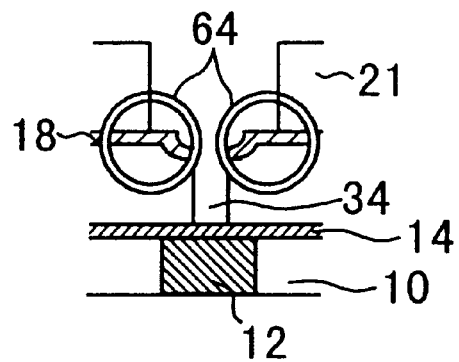

The upper trench resist mask 22 is formed on the upper insulating film 21 by means of photolithography (see FIG. 15B).

The semiconductor substrate is subjected to a dry etching process while the upper trench resist mask 22 is used as a mask, on condition that a silicon oxide film can be removed with a high selective rate with respect to the silicon nitride film. More specifically, while the upper trench resist mask is used as a mask, the upper insulating film 21 is etched away until the protuberance 64 of the upper trench stopper film 18 is exposed. Subsequently, while the protuberance 64 is used as a mask, the lower insulating film 16 is etched away until the connection hole stopper film 14 is exposed in the connector preparation hole 34 (see FIG. 15C).

Figure 15D:
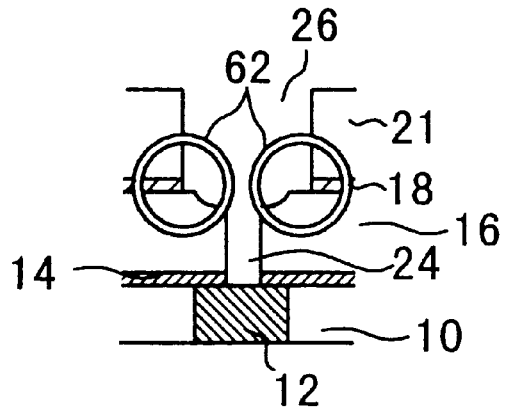

The exposed upper trench stopper film 18 in the upper wiring trench 26 and the exposed connection hole stopper film 14 in the connection preparation hole 34 are removed by means of dry etching (see FIG. 15D).

As in the case with the first embodiment, a desired multilayer wiring structure is formed by deposition of conductive material in the connection hole 24 and the upper wiring trench 26.

The foregoing manufacturing method enables formation of the recess 62 in the vicinity of the upper edge of the connection hole 24, i.e., formation of a large opening area in the vicinity of the upper edge of the connection hole 24. For this reason, the manufacturing method enables barrier metal or metal wiring material to be readily embedded into the connection hole 24, as in the case with the ninth embodiment.

Under the manufacturing method according to the tenth embodiment, the protuberance 64 that has a thickness greater than that of the other regions is formed in the upper trench stopper film 18, and the semiconductor substrate is subjected to an etching process while the protuberance 64 is used as a mask, until the connection preparation hole 34 reaches the connection hole stopper film 18. For this reason, under the tenth embodiment, there can be ensured a large margin for prevention of penetration of a stopper film on a connection hole, which would otherwise impose a problem for an ordinary self-aligned contact etching method.

Since the present invention has the foregoing configuration, the following advantageous results will be yielded:

According to a first aspect of the present invention, a connection for connecting a first wiring pattern to a second wiring pattern has a larger cross-sectional area at one end facing the second wiring pattern and a smaller cross-sectional area at the other end facing the first wiring pattern. Such a connection section can be readily formed by deposition of conductive material into the connection section from its end facing the second wiring pattern. Therefore, when a semiconductor device is miniaturized, the present invention enables establishment of good conductivity between the first and second wiring patterns.

According to a second aspect of the present invention, the connection section is tapered. A tapered connection section can be readily formed without fail by deposition of conductive material into the tapered open space. Therefore, according to the present invention, when the semiconductor device is miniaturized, good conductivity can be readily established between the first and second wiring patterns.

According to a third aspect of the present invention, the connection section is formed from a cylindrical portion and a protuberance portion deposited in a recess portion. The cylindrical connection section can be formed by means of a common method. The connection section according to the present invention can be formed by addition of solely a recess forming step to the manufacturing processes. Therefore, according to the present invention, good continuity can be established between the first and second wiring patterns by means of simple manufacturing processes.

According to a fourth aspect of the present invention, a step structure is formed along a boundary area between a primary conductive section and a connection section both of which constitute a conductive section. In the step structure, there is provided a silicon nitride film which extends beyond the primary conductive section by a predetermined length. For accurate formation of a space for the primary conductive section and a space for the connection section, an effective method is to form large silicon nitride film whose width is greater than the space for the primary conductive section in the boundary region between the spaces and to subject the semiconductor substrate to an etching process while the silicon nitride film is taken as a stopper film. The structure of the semiconductor device according to the present invention enables such an effective etching operation. Further, the structure of the semiconductor device according to the present invention enables the amount of silicon nitride film remaining in the semiconductor device to be reduced to a minimum required amount. Therefore, according to the present invention, the conductive section is accurately formed, and a superior high-speed operation characteristic can be imparted to the semiconductor device.

According to a fifth aspect of the present invention, a space for the connection section can be provided on the primary conductive section while the silicon nitride film is used as a stopper film. Therefore, according to the present invention, a structure having the connection section can be accurately formed on the primary conductive section, and a superior high-speed operation characteristic can be imparted to the semiconductor device.

According to a sixth aspect of the present invention, a space for the primary conductive section can be provided on the connection section while the silicon nitride film is used as a stopper film. A structure according to the present invention can be realized by removal of the exposed silicon nitride film in the space for the primary conductive section. According to the present invention, there can be accurately formed a structure in which the primary conductive section is formed on the connection section, while the amount of remaining silicon nitride film is minimized.

According to the seventh aspects of the present invention, there is formed a connection hole having a larger opening area at the end facing a second wiring pattern and a smaller opening area at the end facing a first wiring pattern. A connection section for establishing continuity between the first and second wiring patterns is formed by deposition of conductive material into the connection hole from the end facing the second wiring pattern. In such a case, the conductive material can be readily deposited in the connection hole without fail, and hence good conductivity can be ensured between the first and second wiring patterns.

The present invention is not limited to the aspects which yield the advantageous result described above. Hereinafter, other aspects of the present invention will be illustratively described.

Eighth Aspect

A method of manufacturing a semiconductor device comprising the steps of:

growing on a silicon substrate a stopper film composed of a silicon nitride film;

etching the stopper film into a predetermined shape;

depositing an insulating film composed of a silicon oxide film in the region including the stopper film;

eliminating a predetermined portion of the insulating film which is smaller than the stopper film until the stopper film is exposed, thereby forming a space penetrating through the insulating film; and eliminating the exposed stopper film in the space.

According to the eighth aspect of the present invention, the silicon nitride film can be formed into a minimum size required for acting as a stopper film. Therefore, the present invention enables accurate formation of a multilayer wiring structure and imparting of a high-speed operation characteristic to the semiconductor device.

Ninth Aspect

The manufacturing method according to the eighth axpect of the present invention, wherein the stopper film is formed on a wiring pattern composed of conductive material and is etched so as to remain in a predetermined shape on the wiring pattern; and wherein the removal of the exposed stopper film from the interior of the space is followed by a step of forming a connection section which establishes continuity with the wiring pattern, by deposition of conductive material into the space.

According to the ninth aspect of the present invention, in a case where a connection section is formed on a wiring pattern, a silicon nitride film can be formed into a minimum size required for acting as a stopper film.

Tenth Aspect

The manufacturing method according to the ninth aspect, wherein the space is a trench to be used for forming a wiring pattern; and the removal of the exposed stopper film from the interior of the space is followed by a step of forming a desired wiring pattern by deposition of conductive material into the space.

According to the tenth aspect of the present invention, in a case where a wiring pattern is formed on a connection section, the silicon nitride film can act as a stopper film, and the amount of silicon nitride film that remains after the end of processing can be minimized.

Eleventh Aspect

A method of manufacturing a semiconductor device comprising the steps of:

growing a first interlayer insulating film on a first wiring pattern;

forming a connection preparation hole by elimination of a predetermined portion of the first interlayer insulating film to a position spaced a given distance away from the first wiring;

depositing a silicon nitride film in the connection preparation hole;

forming on the connection preparation hole a silicon nitride film pattern which has at least a thickness required by the second wiring pattern and is identical in pattern with the second wiring pattern;

growing a second interlayer insulating film on the first interlayer insulating film so as to become thicker than the silicon nitride film pattern;

eliminating the second interlayer insulating film until the silicon nitride film pattern is exposed;

eliminating the silicon nitride film pattern and the silicon nitride film from the interior of the connection preparation hole;

subjecting the first interlayer insulating film to an etch back process by means of anisotropic etching until the first wiring pattern is exposed on the bottom of the connection preparation hole; and forming a connection section and a second wiring pattern by deposition of conducive material in the connection preparation hole and the interior of the space formed by elimination of the silicon nitride film pattern.

Twelfth Aspect

A method of manufacturing a semiconductor device, comprising the steps of:

growing a first interlayer insulating film on a first wiring pattern;

forming on the first interlayer insulating film a silicon nitride film pattern which has at least a thickness required by a second wiring pattern and is identical in pattern with the second wiring pattern;

growing a second interlayer insulating film on the first interlayer insulating film so as to become thicker than the silicon nitride film pattern;

eliminating the second interlayer insulating film until the silicon nitride film pattern is exposed;

forming a connection preparation hole which penetrates through the silicon nitride film pattern and reaches an intermediate position in the first interlayer insulating film;

eliminating the silicon nitride film pattern;

subjecting the first interlayer insulating film to an etch back process by means of anisotropic etching until the first wiring pattern is exposed at the bottom of the connection preparation hole; and forming a connection section and a second wiring pattern by deposition of conducive material in the connection preparation hole and in the space formed by elimination of the silicon nitride film pattern.

According to the eleventh aspect or the twelfth aspect of the present invention, a connection section for connecting a first wiring pattern to a second wiring pattern and the second wiring pattern can be accurately formed without use of a silicon nitride film. Therefore, according to the present invention, a multilayer wiring structure can be accurately formed, and a superior high-speed operation characteristic can be imparted to a semiconductor device.

Further, the present invention is not limited to the embodiments described foregoing, but variations and modifications may be made without departing from the scope of the present invention.

The entire disclosure of Japanese Patent Application No. Hei 10-258331 filed on Sep. 11, 1998 including specification, claims, drawings and summary are incorporated herein by reference in its entirety.

What is claimed is:

1. A method of manufacturing a semiconductor device comprising the steps of:

forming a lower wiring pattern from conductive material;

forming a lower insulating film so as to cover the lower wiring pattern;

forming an upper stopper film on the lower insulating film;

forming an upper insulating film on the upper stopper film;

forming a connection preparation hole penetrating the upper insulating film and the upper stopper film; and forming in the upper insulating film a trench for accommodating an upper wiring pattern by anisotropically etching the upper insulating film at a portion overlapping the connection preparing hole, the etching being performed such that a penetrating hole in the upper stopper film is enlarged during formation of the trench.

2. The method according to claim 1, wherein the etching is performed under a condition in which an etching selective ratio of the upper insulating film with respect to the upper stopper film assumes a value of about 5 to 7.

3. The method according to claim 2, further comprising a step for forming a protective film at a bottom of the connection preparation hole before performing the etching.

4. The method according to claim 2, wherein, in the step for forming the connection preparing hole, the connection preparing hole is formed so as to have a bottom thereof at a position away from a predetermined distance from the lower wiring pattern while penetrating the upper insulating film and the upper stopper film.

5. The method according to claim 2, further comprising a step for forming a lower stopper film underlying the lower insulating film and covering the lower wiring pattern.

6. The method according to claim 3, further comprising a step for forming a lower stopper underlying the lower insulating film and covering the lower wiring pattern.

7. The method according to claim 4, further comprising a step for forming a lower stopper underlying the lower insulating film and covering the lower wiring pattern.

8. A method of manufacturing a semiconductor device comprising the steps of:

forming a lower wiring pattern from conductive material;

forming a lower insulating film so as to cover the lower wiring pattern;

forming an upper stopper film on the lower insulating film;

forming an upper insulating film on the upper stopper film;

forming a penetrating hole in the upper stopper film;

forming in the upper insulating film a trench for accommodating an upper wiring pattern by anisotropically etching the upper insulating film at a portion overlapping the penetrating hole;

forming in the lower insulating film a connection preparing hole communicating with the penetrating hole of the stopper film; and removing a portion of the upper stopper film exposing in the trench by means of a physical sputter etching process intended to eliminate an object to be removed through primarily physical action.

9. The method according to claim 8, further comprising a step for forming a lower stopper film underlying the lower insulating film and covering the lower wiring pattern.

10. A method of manufacturing a semiconductor device comprising the steps of:

forming a lower wiring pattern from conductive materiel;

forming a lower insulating film so as to cover the lower wiring pattern;

forming a recess at a predetermined location of the lower insulating film;

forming an upper stopper film on the lower insulating film;

forming an upper insulating film on the upper stopper film;

forming a penetrating hole in the upper stopper film at a portion covering the recess of the lower insulating film;

forming in the upper insulating film a trench for accommodating an upper wiring pattern by anisotropically etching the upper insulating film at a portion overlapping the penetrating hole;

forming in the lower insulating film a connection preparing hole communicating with the penetrating hole of the stopper film; and removing a portion of the upper stopper film exposing in the trench.

11. The method according to claim 10, wherein the upper stopper film is formed in such a way that a portion corresponding to the recess becomes thicker than the other regions of the same.

* * * * *